US009006907B2

(12) United States Patent
Secker et al.

(10) Patent No.: US 9,006,907 B2
(45) Date of Patent: Apr. 14, 2015

(54) DISTRIBUTED ON-CHIP DECOUPLING APPARATUS AND METHOD USING PACKAGE INTERCONNECT

(71) Applicant: Rambus Inc., Sunnyvale, CA (US)

(72) Inventors: David Secker, San Jose, CA (US); Ling Yang, San Jose, CA (US); Chanh Tran, San Jose, CA (US); Ying Ji, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/903,323

(22) Filed: May 28, 2013

(65) Prior Publication Data

US 2013/0320560 A1 Dec. 5, 2013

Related U.S. Application Data

(60) Provisional application No. 61/652,775, filed on May 29, 2012, provisional application No. 61/716,713, filed on Oct. 22, 2012.

(51) Int. Cl.
*H01L 23/48* (2006.01)
*H01L 21/768* (2006.01)
*H01L 23/528* (2006.01)
*H01L 25/18* (2006.01)
(Continued)

(52) U.S. Cl.
CPC ............ *H01L 23/481* (2013.01); *H01L 21/768* (2013.01); *H01L 2224/16227* (2013.01); *H01L 2224/16225* (2013.01); *H01L 23/5286* (2013.01); *H01L 25/18* (2013.01); *H01L 2225/06541* (2013.01); *H01L 23/49816* (2013.01); *H01L 23/49827* (2013.01); *H01L 23/5223* (2013.01)

(58) Field of Classification Search
USPC ................. 257/621, 777, E25.006, E25.021, 257/E25.027, E23.085
See application file for complete search history.

(56) References Cited

U.S. PATENT DOCUMENTS 7,002,248 B2 * 2/2006 Akram et al. ................. 257/724
7,352,602 B2 * 4/2008 Janzen ............................ 365/63
7,777,326 B2   8/2010 Chen
(Continued)

OTHER PUBLICATIONS

Song et al., "Decoupling Capacitor Stacked Chip (DCSC) in TSV-based 3D-ICs," 2011 IEEE 20th Conference on Electrical Performance of Electronic Packaging and Systems, Oct. 23-26, 2011; pp. 235-238. 4 pages.
(Continued)

*Primary Examiner* — Jasmine Clark
(74) *Attorney, Agent, or Firm* — Lance M. Kreisman; Peninsula Patent Group

(57) ABSTRACT

An integrated circuit device is disclosed. The integrated circuit device includes a semiconductor die fabricated by a front-end semiconductor process and having oppositely disposed planar surfaces. The semiconductor die is formed with semiconductor devices, power supply circuitry coupled to the semiconductor devices, decoupling capacitance circuitry, and through-vias. The through-vias include a first group of vias coupled to the power supply circuitry and a second group of vias coupled to the decoupling capacitance circuitry. Conductors are formed in a first metal layer disposed on the semiconductor die in accordance with a back-end semiconductor process. The conductors are configured to couple to the first and second groups of through-vias to establish conductive paths from the power supply circuitry to the decoupling capacitance circuitry.

11 Claims, 5 Drawing Sheets

(51) Int. Cl.
 *H01L 23/522* (2006.01)
 *H01L 23/498* (2006.01)

(56) References Cited

U.S. PATENT DOCUMENTS

| | | |
|---|---|---|
| 7,880,297 B2 | 2/2011 | Jao et al. |
| 8,110,926 B2 | 2/2012 | Grygiel |
| 8,114,753 B2 | 2/2012 | El-Kareh |
| 2010/0019347 A1 | 1/2010 | McLellan et al. |
| 2012/0080222 A1 | 4/2012 | Kim et al. |

OTHER PUBLICATIONS

Tegueu et al., "Integration of Tantalum Pentoxide Capacitors with Through-Silicon Vias," IEEE Transactions on Components, Packaging and Manufacturing Technology, vol. 1, No. 10, Oct. 2011, pp. 1508-1516. 9 pages.

* cited by examiner

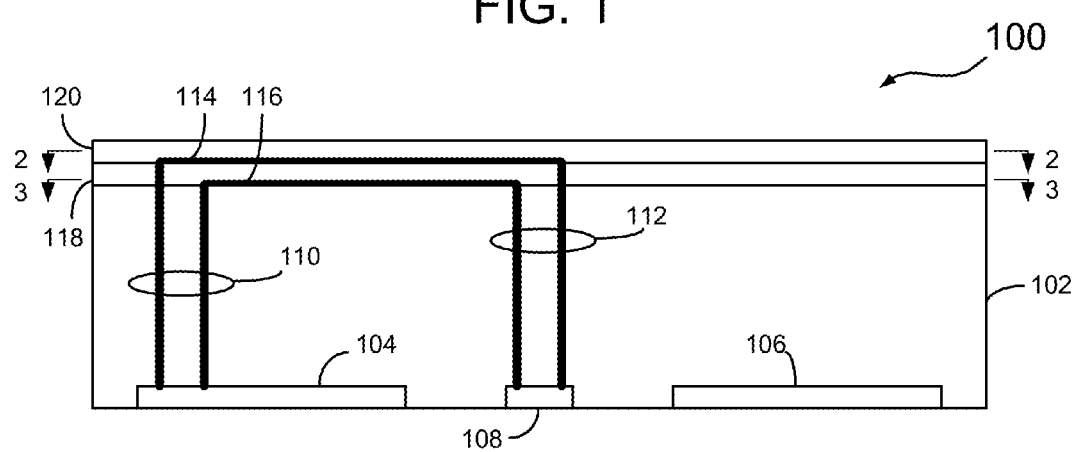
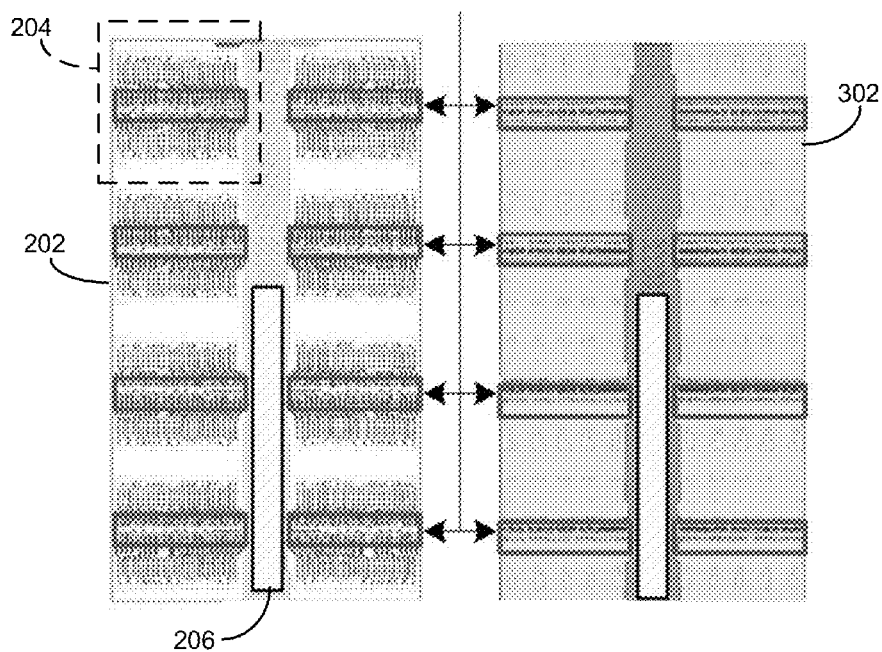

DISTRIBUTED ON-CHIP DECOUPLING APPARATUS AND METHOD USING PACKAGE INTERCONNECT

RELATED APPLICATIONS

This application claims the benefit of priority under 35 U.S.C. 119(e) to Provisional Application Ser. No. 61/652,775, filed May 29, 2012, entitled DISTRIBUTED ON-CHIP DECOUPLING CAPACITANCE USING PACKAGE INTERCONNECT, and to Provisional Application Ser. No. 61/716,713, filed Oct. 22, 2012, entitled DISTRIBUTED ON-CHIP DECOUPLING APPARATUS AND METHOD USING PACKAGE INTERCONNECT, both priority applications are incorporated herein by reference in their entirety for all purposes.

TECHNICAL FIELD

The disclosure herein relates to integrated circuits, and more specifically to methods and apparatus for decoupling power supply noise events from memory system circuits.

BACKGROUND

On-chip power supplies play an important role in the successful operation of integrated circuit (IC) chips. One design consideration involves how to decouple the power supply from noise resulting from normal operation of the IC semiconductor devices. This is often accomplished by coupling the power supply to a sufficient amount of decoupling capacitance formed on the chip itself.

In some instances, a given IC architecture may constrain the placement of on-chip decoupling capacitance, creating a routing problem. IC routing conductors formed in standard front-end process metal layers often exhibit high impedances in the form of resistance and inductance. A high level of impedance in series with decoupling capacitance is undesirable in the context of high-frequency switching power supplies.

Thus, the need exists for an improved interconnection scheme for IC power supply circuitry.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 1 illustrates a partial cross-sectional side view of an integrated circuit (IC) memory controller according to one embodiment;

FIG. 2 illustrates a top view of a redistribution layer (RDL) of metal along line 2-2 of FIG. 1;

FIG. 3 illustrates a top view of a back-side-metal (BSM) layer along line 3-3 of FIG. 1;

DETAILED DESCRIPTION

Figure 4:
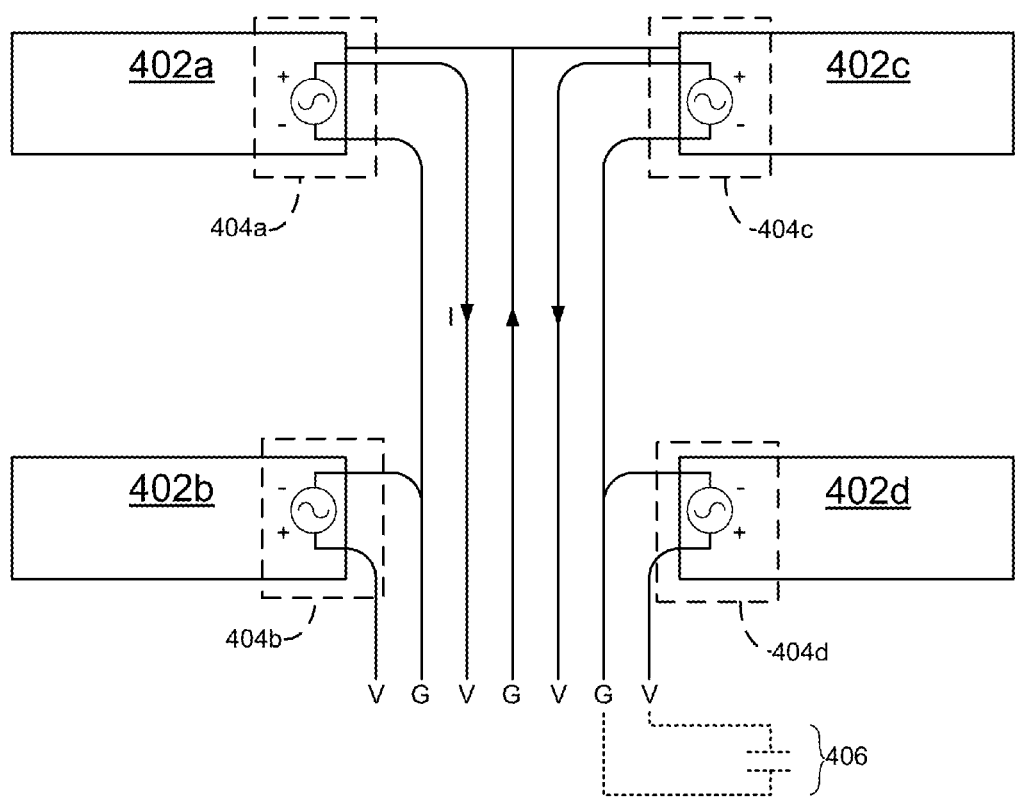
FIG. 4 illustrates a partial schematic representation for one embodiment of routing paths formed in the RDL or BSM layers of FIGS. 2 and 3.

Embodiments of an integrated circuit (IC) device are disclosed. In one embodiment, the IC device includes a semiconductor die fabricated by a front-end semiconductor process and having oppositely disposed planar surfaces. The semiconductor die is formed with semiconductor devices, power supply circuitry coupled to the semiconductor devices, decoupling capacitance circuitry, and through-vias. The through-vias include a first group of vias coupled to the power supply circuitry and a second group of vias coupled to the decoupling capacitance circuitry. Conductors are formed in a first metal layer disposed on the semiconductor die in accordance with a back-end semiconductor process. The conductors are configured to couple to the first and second groups of through-vias to establish conductive paths from the power supply circuitry to the decoupling capacitance circuitry.

In a further embodiment, a semiconductor device is disclosed. The semiconductor device includes an integrated circuit (IC) memory device and an IC memory controller. The IC memory device includes a semiconductor memory die formed with a first group of interface circuits. The first group of interface circuits is distributed across the semiconductor memory die in a first spaced-apart pattern. The semiconductor memory die also includes a first group of through-vias. The IC memory controller is stacked with the IC memory device and includes a semiconductor controller die formed with a second group of interface circuits. The second group of interface circuits is distributed across the semiconductor controller die in a second pattern that substantially aligns with the first group of interface circuits. The semiconductor controller die is formed with a third circuit separate from the second group of interface circuits and a second group of through-vias. The second group of through-vias couple to the first group of through-vias, to the second group of interface circuits, and to the third circuit. Back-end of line (BEOL) metal is formed on the semiconductor controller die to electrically contact the through-vias to complete one or more conductive paths that couple the second group of interface circuits to the third circuit.

FIG. 1 illustrates a partial cross sectional side view of an integrated circuit, generally designated 100. The integrated circuit, or chip, is formed from a silicon wafer and includes a bulk substrate 102 with memory interface circuits 104 and 106 formed therein. Other logic and control circuits are also provided, but not shown or described herein for purposes of clarity. A decoupling or bypass capacitor circuit 108 is formed on-chip to suppress power supply-related noise generated internally through operation of the interface circuits.

In one embodiment, the integrated circuit 100 is a memory controller that manages operation of one or more DRAM memory devices. In a further specific embodiment, the memory controller is architected such that the interface circuits typically formed in the DRAM memory devices are instead formed on the memory controller. Generally, the interface circuitry includes the PHY or I/O circuitry that transmits and receives data and control for signals between the memory device(s) and the memory controller. In this manner, the DRAM memory devices may be manufactured substantially entirely in accordance with a DRAM memory fabrication process, without the design and performance tradeoffs associated with hybrid memory/logic technology processes. The resulting "disaggregation" of memory process technology (embodied by the memory devices) and logic process technology (embodied by the memory controller) enhances device yields, and improves performance of the memory system, among other things.

Further referring to FIG. 1, the memory interface circuits 104 and 106 are organized on the memory controller 100 such that, when stacked with the DRAM memory device(s), the circuitry substantially aligns with similarly grouped storage cell arrays on the memory devices. This vertical alignment enables for convenient vertical integration and communication between the memory controller and memory devices utilizing through-silicon-vias. However, since the memory interface circuits on the controller include logic circuitry typically provided on the memory device(s), the amount of circuit area within each interface circuit normally reserved for bypass capacitance is greatly constrained. As a result, the bulk of the bypass capacitance is provided by the bypass capacitor circuit 108, which, as shown in FIGS. 2 and 3, is distributed across a central region of the chip and which may be shared by various memory interface circuits.

With continued reference to FIG. 1, a unique way of electrically coupling power supply connections for each memory interface circuit 104 and 106 to the bypass capacitor circuit 108 is employed that reduces undesirable parasitic impedance. While directly routing conductors between the bypass capacitor circuit 108 and each memory interface circuit 104 and 106 may be performed through front end on-chip metal routing techniques, the resulting conductors generally exhibit poor impedance characteristics, especially when routed over long distances (such as 10 mm). To address this, groups of through-silicon vias 110 and 112 are formed into the bulk silicon substrate 102 to access low-resistivity conductors 114 and 116 formed on one or more back-end-of-line (BEOL) metal layers 118 and 120.

In one embodiment, the back-end metal layers 118 and 120 are formed on the integrated circuit chip 100 after standard front end wafer processing steps. Such layers include redistribution layers (RDL) and back-side metal (BSM) layers. As opposed to the relatively high resistivities (such as 20 milliohms per square or higher) of on-chip metal conductors, the BEOL conductors have larger widths and thicknesses that provide more metal for a given path, thus resulting in significantly lower resistivities for the paths. For one embodiment, the resistivities may be around 5 milliohms per square or lower. As a result, routing from the active interface circuit 104 up through the first group of TSVs 110, then across the BEOL conductors 118 and 120 and back down through the second set of TSVs 112 has significantly better noise suppression properties than an on-chip direct routing scheme.

Although not to scale, FIG. 2 illustrates one embodiment of an RDL layer 202 that shows eight routed conductor groups, one of which is identified within phantom rectangle 204. Two of the conductor groups correspond to the memory interface circuits 104 and 106 of FIG. 1. In this specific embodiment, the RDL layer 202 forms a power plane that routes power VDD conductors associated with power supply circuits for each of the memory interface circuits to a bypass capacitance connection zone 206. Similarly, FIG. 3 shows a back-side metal (BSM) layer 302 that has comparable routings for ground GND conductors disposed on a ground plane formed by the BSM layer. In other embodiments, the RDL may be assigned as a ground plane, while the BSM layer routes power conductors as a power plane.

FIG. 4 illustrates a partial schematic representation of a simplified routing scheme that is consistent with the embodiments described above in relation to FIGS. 1-3. A plurality of memory interface circuits 402a-402d are shown, each including a respective power supply circuit 404a-404d. Each power supply circuit provides a supply voltage V and corresponding current I that is distributed throughout the memory interface circuit for powering the active devices therein. To minimize noise attributable to transient operation of the various active devices, each power supply feeds respective power V and ground G connections to the bypass capacitor circuit 406 (represented by phantom lines) via plural ground and power paths. As noted above, in a specific embodiment, all of the ground conductor routing is formed on the BSM layer, while all of the power routing is formed on the RDL layer. In other embodiments, the power and ground layers may be reversed.

Figure 5:
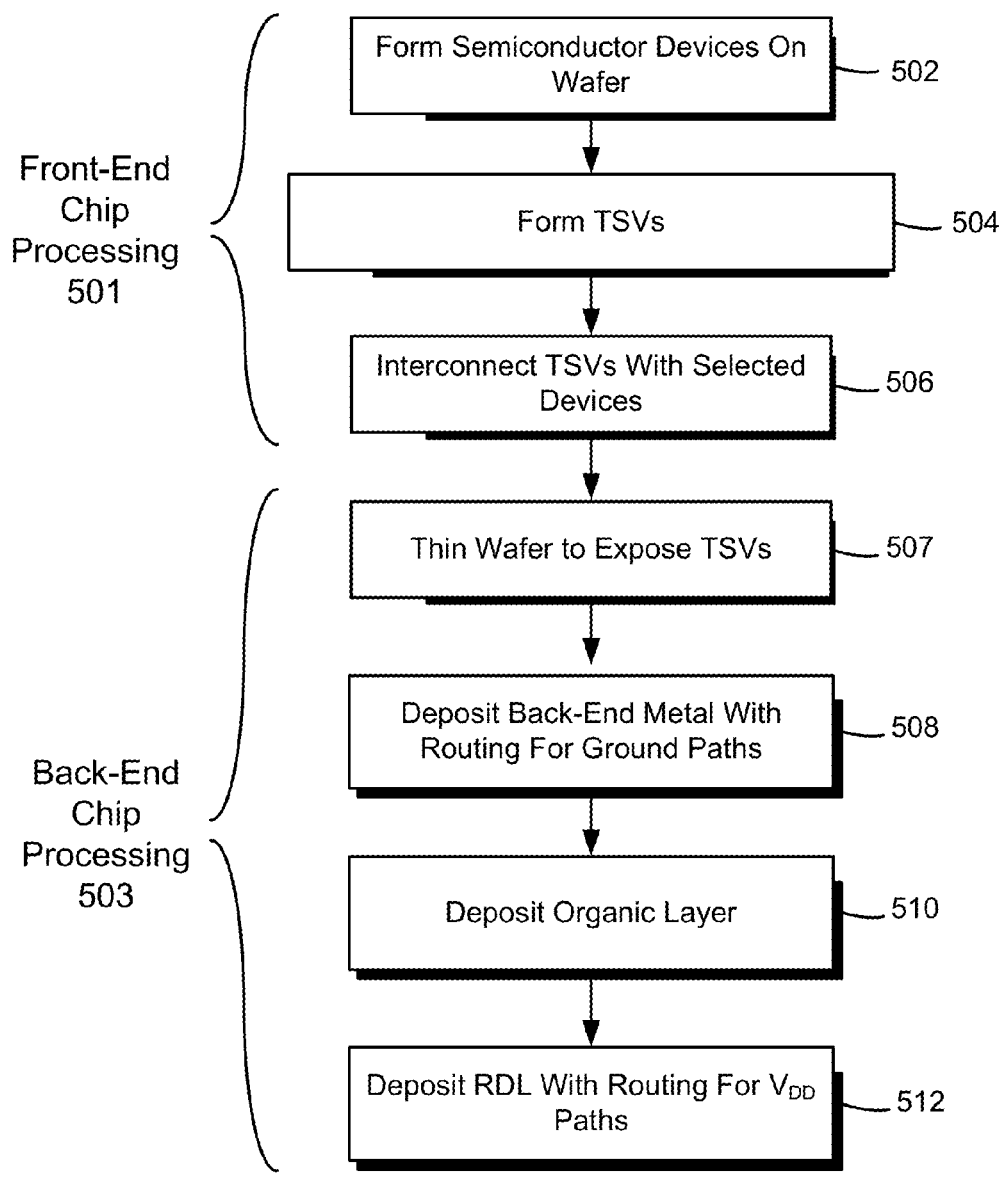
FIG. 5 illustrates a flowchart identifying steps employed in one embodiment of a method of fabricating the memory controller of FIGS. 1-3.

Manufacture of the integrated circuit memory controller 100 may be handled in a variety of ways, with one specific embodiment set forth generally in the flowchart of FIG. 5. The processing generally involves a sequence of front-end chip processing steps 501 to form the basic chip structure, followed by a series of back-end chip processing steps 503 to thin the wafer and form additional metal layers. Fabrication generally begins with processing of a silicon wafer to form active devices in accordance with a logic process technology, at step 502. The TSVs are then formed into the wafer, at step 504, such that they electrically couple to selected devices in the chip circuitry, such as the bypass capacitor circuit and the memory interface circuits, at step 506. At this point, the TSVs do not penetrate the entire thickness of the wafer, and one end of each TSV will be unconnected. The wafer is then thinned such that the unconnected ends of the TSVs are exposed on the back side of the wafer, at 507. A back side metal (BSM) layer may then be deposited over the unconnected TSV ends and etched or otherwise processed to form appropriate ground path routing between the bypass capacitor circuit and the active interface circuits, at step 508. Once the BSM layer is established, an RDL layer may then be formed. This involves first depositing an organic layer of material over the BSM layer, at step 510, then depositing the actual RDL metal and processing the layer to develop the power VDD routing paths between the vias connected to the active interface and the vias connected to the bypass capacitor circuit, at step 512.

The embodiment described above utilizes separate ground and power metal layers to route the corresponding ground GND and power VDD conductors between the active interface circuit power supplies and the bypass capacitor circuit. Utilizing the separate layers enables for tight electromagnetic coupling between the power and ground paths. This provides an advantage in minimizing inductance.

Figure 6:
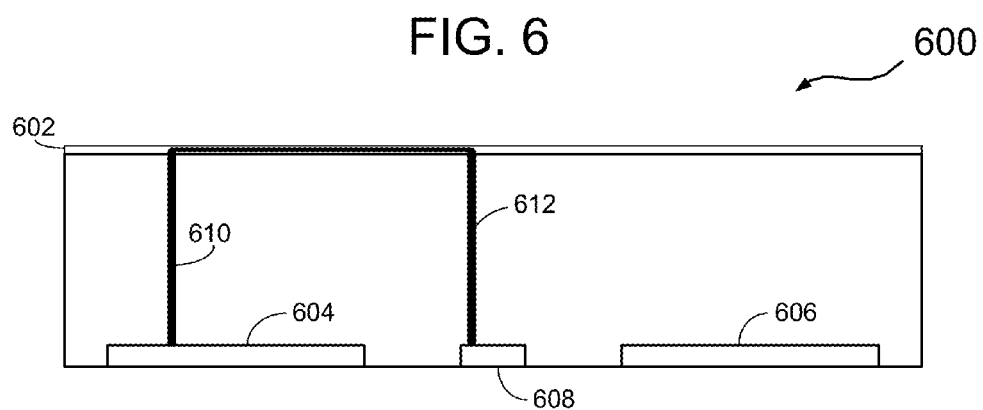
FIG. 6 illustrates a partial cross-sectional side view of an IC memory controller similar to FIG. 1.

FIG. 6 illustrates an embodiment of an integrated circuit 600 that employs a single BEOL metal layer 602 to couple memory interface circuits 604 and 606 to a bypass capacitor circuit 608. Like the dual BEOM metal layer embodiment illustrated in FIG. 1, the single BEOL layer 602 routes power VDD and ground GND connections between a first group of through-silicon vias 610 that are coupled at one end to the active interface circuit, and a second group of through-silicon-vias 612 that are coupled to the bypass capacitor circuit 608. Since through-silicon-vias are employed in the integrated circuit, the single BEOL metal layer is embodied as a BSM layer. Utilizing a single BEOL metal layer saves manufacturing costs by avoiding RDL processing. In other embodiments, the BSM layer is substituted by an RDL layer to avoid BSM layer processing.

To minimize inductance, the power and ground conductors that are formed in the BSM layer 602 are interdigitated, as shown in the schematic of FIG. 4 that was previously described. With the respective current for each path going in opposite directions, any electromagnetic coupling effects from individual conductors may be cancelled out. In one embodiment, the actual routing may be handled by employing wide strips of metal, known as stripes, across the routing area.

Figure 7:
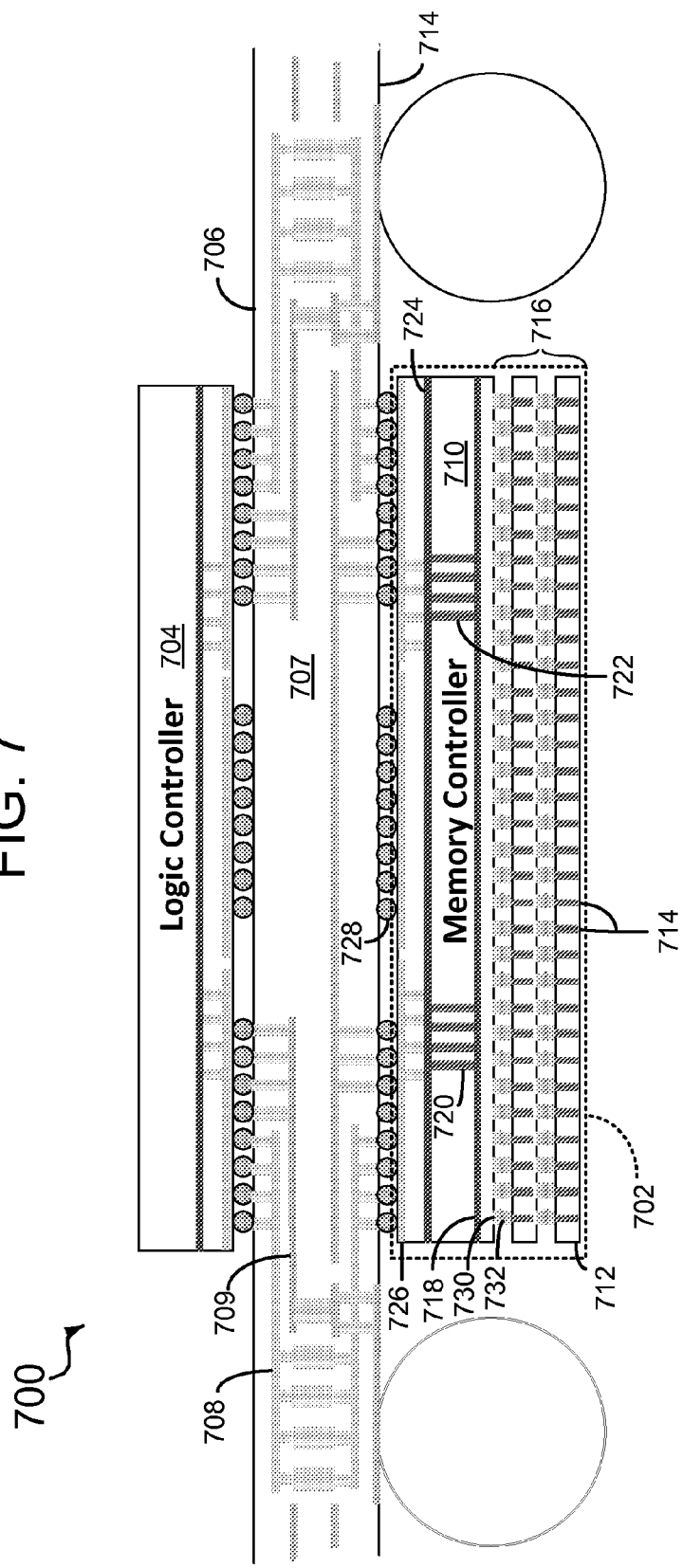
FIG. 7 illustrates a cross-sectional side view of a computing system according to one embodiment.

FIG. 7 illustrates one specific embodiment of a computing system, generally designated 700, that employs a memory system 702. The computing system includes a logic controller 704, such as a microprocessor or graphics processor that is mounted to a first side 706 of a rigid substrate, such as a circuit board 707. The circuit board is formed with multiple routing layers such as at 708 and 709. The board includes a backside 714 that is oppositely disposed to the logic controller 704. The circuit board layers and vias allow for signal transfer from one side of the board to the other, and thus between the logic controller 704 and the memory system 702.

With continued reference to FIG. 7, the memory system 702 includes a memory controller 710 described above and plural DRAM memory die 712 that are stacked with the memory controller. Each of the DRAM memory dies is formed substantially in accordance with a DRAM process to minimize the amount of logic circuitry on each DRAM chip. Further, each die is formed with through-silicon-vias 714 to interconnect certain signaling bus paths, power and ground paths, and so on between the DRAM devices. The collection of DRAM devices together form a DRAM stack 716.

In one embodiment, the memory controller 710 is formed substantially in accordance with the integrated circuit memory controller 100 described above and shown in FIGS. 1-4. In this respect, the controller includes an active circuit region 718 that is tapped by groups of through-silicon-vias 720 and 722 to route power, ground, and signal paths to a BSM layer 724. A further RDL layer 726 is provided over the BSM layer and includes pads (not shown) to engage a C4 ball grid array 728. On the opposite side of the controller, an array of bond pads 730 are formed adjacent the active region 718. The bond pads engage and mount to similarly spaced contacts or pads 732 disposed on one side of the DRAM memory device stack 716.

Further referring to FIG. 7, the memory system 702 mounts to the circuit board backside 714 through the various C4 ball grid array connections 728. The resulting assembly lends itself well to applications that benefit from miniaturized computing systems, such as cell phones, tablet computing devices, and so forth.

Figure 8:
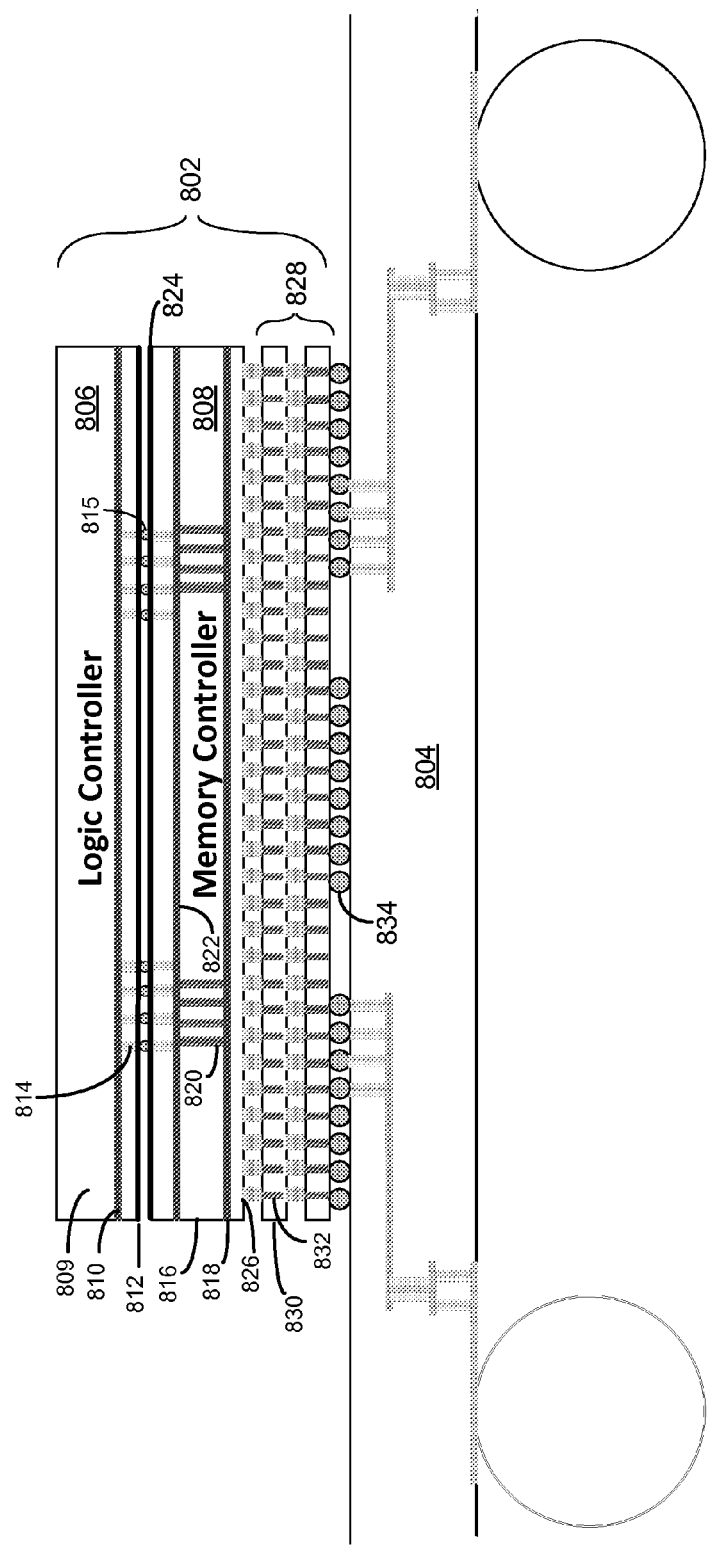
FIG. 8 illustrates a cross-sectional side view of an alternative embodiment of a computing system similar to FIG. 7.

FIG. 8 illustrates a further embodiment of a computing system 800 similar to the system 700 of FIG. 7. The system includes a system module 802 that mounts to a multi-layer circuit board 804. The module includes a logic controller circuit 806 stacked with a memory controller circuit 808. In the specific embodiment shown, the logic controller 806 includes a first substrate portion 809 formed with an active circuit layer 810. A first RDL layer 812 is formed beneath the active circuit layer and couples to the active devices with RDL vias 814.

Further referring to FIG. 8, the memory controller circuit 808 includes a second substrate portion 816 formed with a second active circuit layer 818. Through-silicon-vias 820 are formed in the substrate to vertically connect portions of the second active circuit layer to a BSM metal layer 822. A second RDL layer 824 is formed over the BSM layer 822, and interconnects with the first RDL layer 812 associated with the logic controller circuit 806 via an array of vertical bonding structures, such as C4 bumps or microbumps 815. The front-side (adjacent the second active device layer) of the memory controller circuit 808 includes bond pads 826 that allow it to interface electrically with a DRAM memory device stack 828. The DRAM stack includes multiple DRAM memory devices 830 that are formed with TSVs 832 to allow for tight vertical integration. A bottom-most side of the DRAM device stack 828 employs a ball grid array of contacts 834 to interface with correspondingly formed contacts on the multi-layer circuit board 804.

Those skilled in the art will appreciate the many benefits and advantages afforded by the embodiments presented herein. By incorporating BEOL metal processing and TSVs to supplement the routing of power supply conductors between interface circuits and bypass capacitance, parasitic impedance acting on the conductors may be minimized. This, in turn, minimizes noise generated in the system, which translates to better system performance during operation.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A semiconductor device comprising:
an integrated circuit memory device including
a semiconductor memory die formed with a first group of storage circuits, the first group of storage circuits distributed across the semiconductor memory die in a first spaced-apart pattern; and
an integrated circuit memory controller stacked with the integrated circuit memory device, the integrated circuit memory controller including
a semiconductor controller die formed with a first group of interface circuits distributed across the semiconductor controller die in a second pattern that substantially aligns with the first group of storage circuits, the semiconductor controller die formed with a third circuit separate from the first group of interface circuits and a first group of through-vias that couple to the first group of interface circuits, and to the third circuit,
back-end metal formed on the semiconductor controller die to electrically contact the through-vias to complete one or more conductive paths that couple the second group of interface circuits to the third circuit.

2. The semiconductor device of claim 1 wherein:
the second group of interface circuits includes power supply circuitry; and
the third circuit comprises decoupling capacitance circuitry.

3. The semiconductor device of claim 1 wherein:
the semiconductor memory die comprises a plurality of memory dies disposed in a stacked arrangement and interconnected by respective groups of through-silicon-vias.

4. The semiconductor device of claim 3 further comprising:
a substrate having first and second oppositely disposed planar sides;
an integrated circuit logic controller disposed on the first substrate planar side; and
wherein the integrated circuit memory device and the integrated circuit memory controller are mounted on the second substrate planar side.

5. The semiconductor device of claim 1 wherein the back-end metal comprises a back-side metal (BSM) layer.

6. The semiconductor device of claim 5 wherein:
the BSM includes striped ground and power paths.

7. The semiconductor device of claim 5 wherein the back-end metal comprises a redistribution (RDL) layer.

8. The semiconductor device of claim 7 wherein the RDL includes striped ground and power paths.

9. The semiconductor device of claim 1 wherein the back-end metal comprises:
a first back-side metal (BSM) layer for routing ground signal paths; and
a redistribution layer (RDL) for routing power signal paths, the RDL formed in an overlying relationship with the BSM.

10. The semiconductor device of claim 1 and further comprising:
an integrated circuit logic controller coupled to the integrated circuit memory controller.

11. The semiconductor device of claim 10 wherein:
the integrated circuit logic controller and the integrated circuit memory controller are formed on the same integrated circuit chip.

* * * * *